US 8,537,545 B2

(12) United States Patent
Peng et al.

(10) Patent No.: US 8,537,545 B2
(45) Date of Patent: Sep. 17, 2013

(54) SERVER HOLDER AND SERVER SYSTEM (75) Inventors: Wen-Tang Peng, New Taipei (TW); Hai-Chen Zhou, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 135 days.

(21) Appl. No.: 13/217,296

(22) Filed: Aug. 25, 2011

(65) Prior Publication Data

US 2012/0293954 A1 Nov. 22, 2012

(30) Foreign Application Priority Data

May 18, 2011 (CN) .......................... 2011 1 0128936

(51) Int. Cl.
*G06F 1/16* (2006.01)
*H05K 7/18* (2006.01)

(52) U.S. Cl.
USPC ....................................... 361/679.58; 211/26

(58) Field of Classification Search
USPC .................. 211/26; 312/119; 361/726, 727, 361/741, 756, 796, 797, 802, 826, 725
See application file for complete search history.

(56) References Cited

U.S. PATENT DOCUMENTS

| 5,393,135 | A | * | 2/1995 | Tisbo et al. | .................. | 312/9.48 |
| 5,805,075 | A | * | 9/1998 | Carlson et al. | ................. | 312/215 |
| 6,099,098 | A | * | 8/2000 | Leong | ........................... | 312/333 |
| 2003/0116514 | A1 | * | 6/2003 | Broome | .......................... | 211/26 |
| 2009/0303668 | A1 | * | 12/2009 | Zhao et al. | ............... | 361/679.01 |

* cited by examiner

*Primary Examiner* — Timothy Thompson
*Assistant Examiner* — Charles Pizzuto
(74) *Attorney, Agent, or Firm* — Altis Law Group, Inc.

(57) ABSTRACT

A server holder includes two opposite lateral plates and a number of supporting structures. Each lateral plate includes a main body, a number of strip-shaped portions protruding outwards from the main body, and a number of upper connecting portions. Each upper connecting portion connects a top end of one strip-shaped portion to the main body. Each strip-shaped portion and an adjacent upper connecting portion cooperatively define a number of T-shaped latching grooves running through the strip-shaped portion and the upper connecting portion. Each supporting structure includes a fixing strip, a supporting strip, and a number of T-shaped latching protrusions. The fixing strip is attached to the inner surface of the strip-shaped portion. The supporting strip connects to a side of the fixing strip for supporting a server. The T-shaped latching protrusions extend upwards from the fixing strip. Each T-shaped latching protrusion is latched in the T-shaped latching groove.

20 Claims, 9 Drawing Sheets

SERVER HOLDER AND SERVER SYSTEM

BACKGROUND

1. Technical Field

The present disclosure relates to electronic device holders, and particularly to a server holder and a server system including the server holder.

2. Description of Related Art

With the development of information technology, data centers with a large number of servers are widely used. In order to save space, these servers are typically received in server holders. Each server holder can receive a number of servers. Typically, the server holder includes a bottom plate, a top plate opposite to the bottom plate, and two opposite lateral plates connecting between the bottom plate and the top plate. Each lateral plate has a number of supporting structures for supporting the servers. However, the supporting structures are usually fixed on the lateral plate of the server holder with screws, as a result, the supporting structures are difficult to be assembled or disassembled.

What is needed is an electronic device which can ameliorate the above-mentioned limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of the present disclosure will now be described in detail below, with reference to the accompanying drawing.

Figure 1:
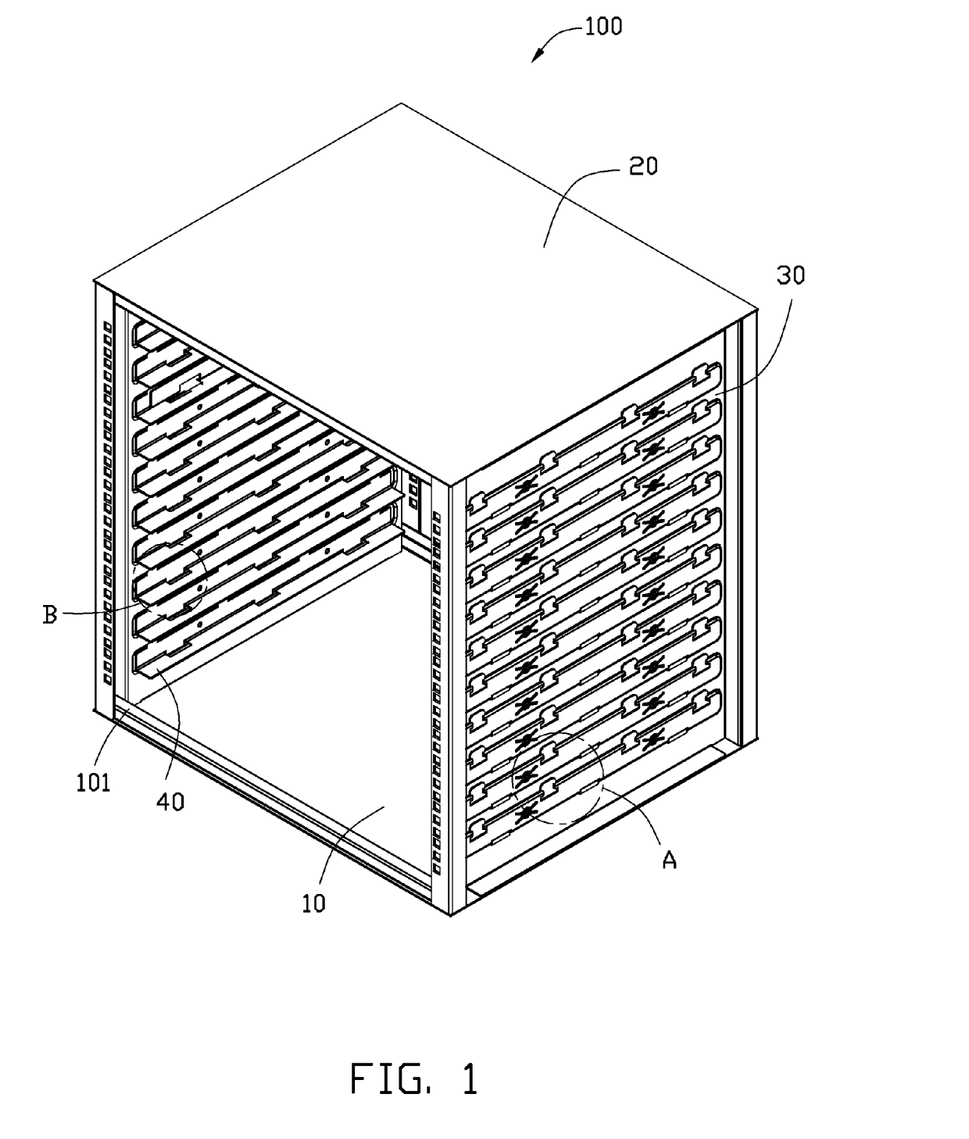
FIG. 1 is a schematic view of a server holder according to an exemplary embodiment.
Figure 2:
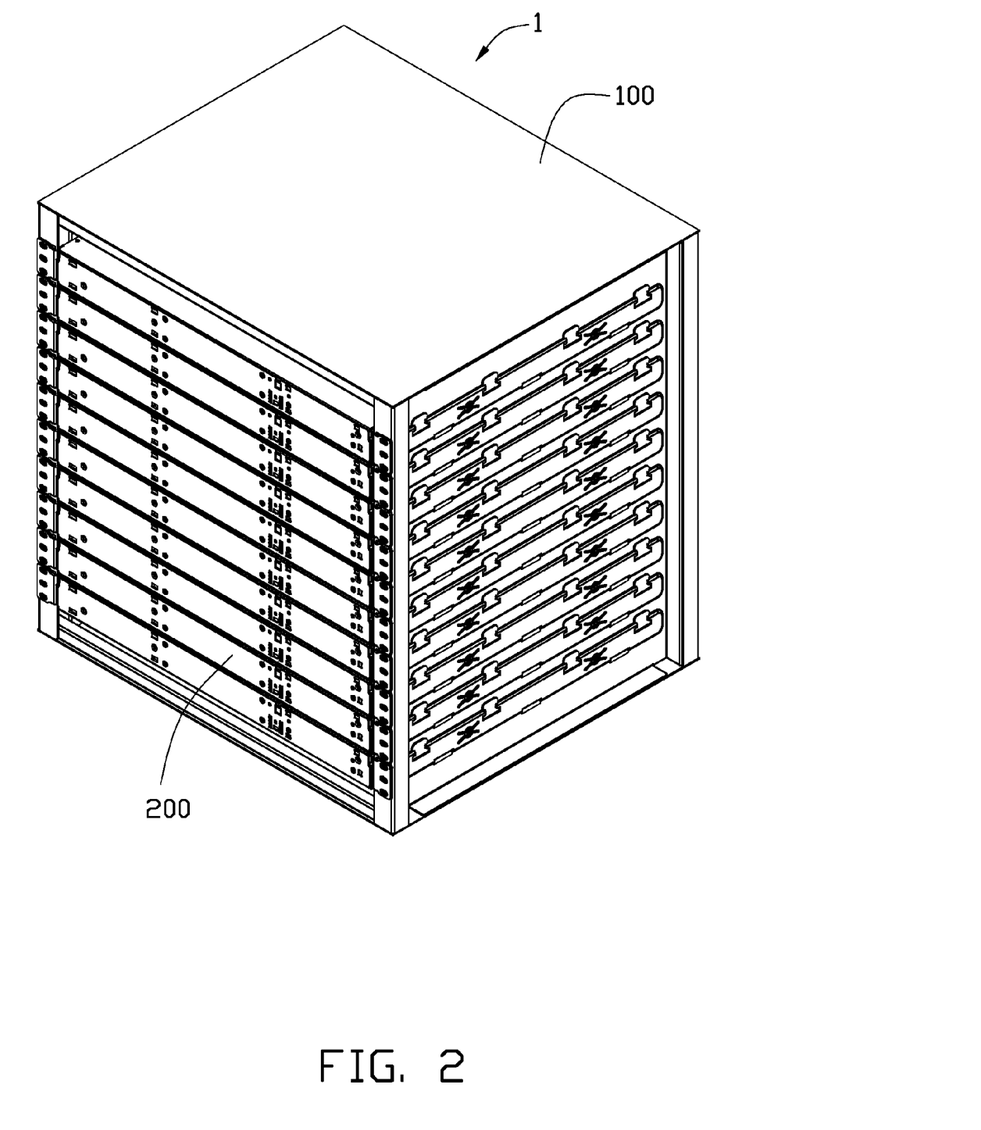
FIG. 2 is a schematic view of a server system having the server holder of FIG. 1.

Referring to FIGS. 1 and 2, a server system 1 according to an exemplary embodiment is shown. The server system 1 includes a server holder 100 and a number of servers 200 received in the server holder 100. The server holder 100 includes a bottom plate 10, a top plate 20, two opposite lateral plates 30, and a number of supporting structures 40 assembled on the lateral plates 30.

The bottom plate 10 is opposite to the top plate 20. The two opposite lateral plates 30 are connected between the bottom plate 10 and the top plate 20. The server holder 100 defines an insert opening 101 between the two opposite lateral plates 30, the servers 200 can be inserted into the server holder 100 through the insert opening 101. In the present embodiment, the two opposite lateral plates 30 are parallel to each other, and are perpendicular to the bottom plate 10 and the top plate 20.

Figure 3:
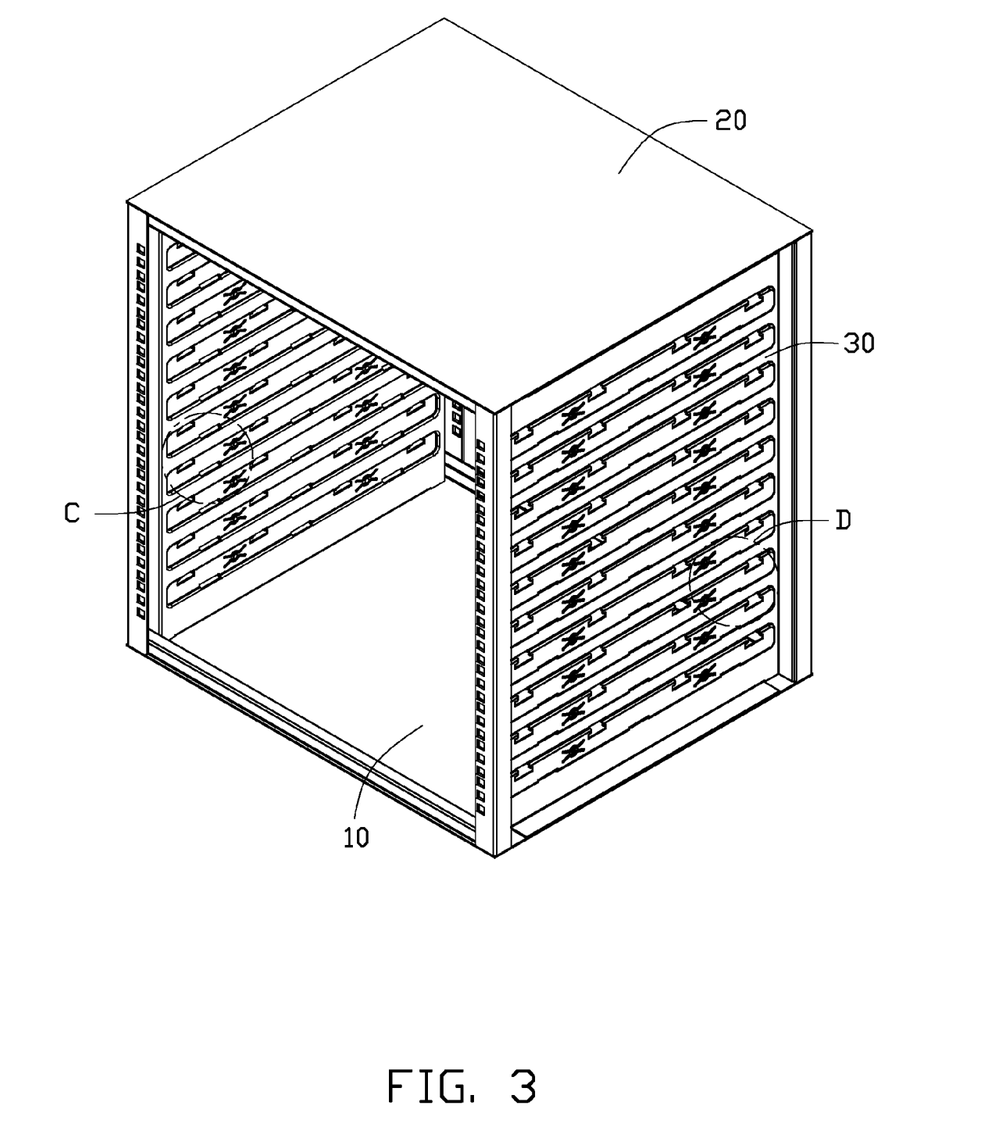
FIG. 3 is a schematic view of the server holder of FIG. 1 without supporting structures.
Figure 4:
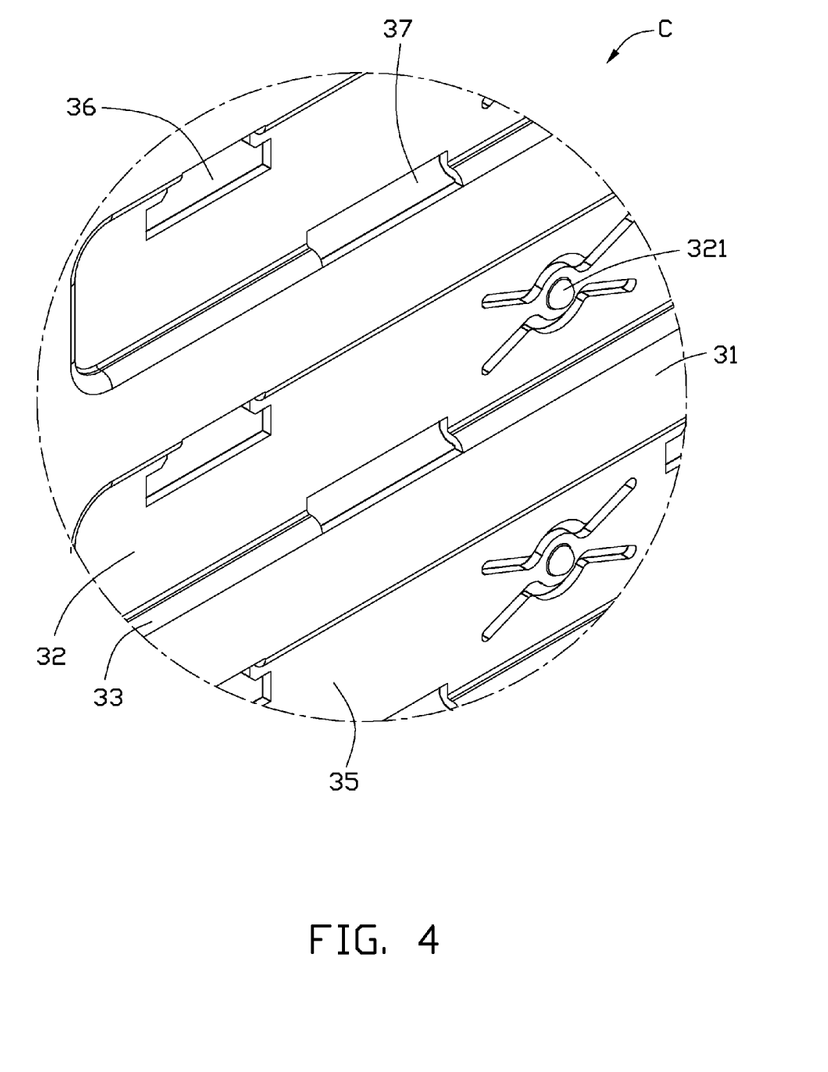
FIG. 4 is a magnified view of the circled portion C of FIG. 3.
Figure 5:
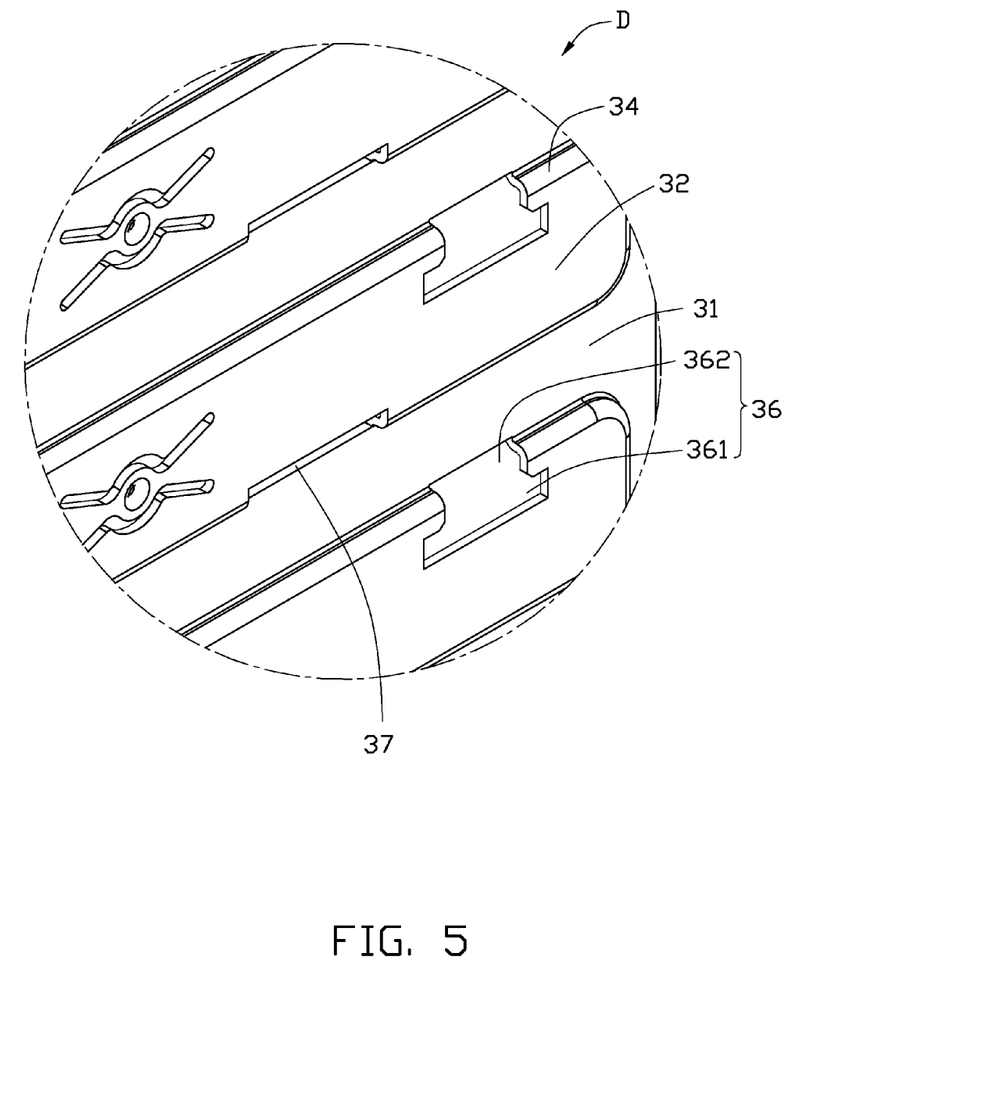
FIG. 5 is a magnified view of the circled portion D of FIG. 3.

Further referring to FIGS. 3 to 5, each lateral plate 30 includes a main body 31, a number of strip-shaped portions 32 protruding outwards from the main body 31, a number of upper connecting portions 34, and a number of lower connecting portions 33. In one embodiment, the lateral plate 30 is an integrative configuration.

The strip-shaped portions 32 extend transversely on the lateral plate 30, and are spaced from and parallel to each other. The strip-shaped portions 32 are substantially parallel to the main body 31. Each upper connecting portion 34 connects the top end of a corresponding strip-shaped portion 32 to the main body 31, and each lower connecting portion 33 connects the bottom end of a corresponding strip-shaped portion 32 to the main body 31. The upper connecting portion 34 and the lower connecting portion 33 protrude outwards from the main body 31. The inner surface of the strip-shaped portion 32 and the inner surfaces of the upper connecting portion 34 and the lower connecting portion 33 connecting to the strip-shaped portion 32 cooperatively define a receiving groove 35.

Each strip-shaped portion 32 and the upper connecting portion 34 connecting to the strip-shaped portion 32 cooperatively define a number of T-shaped latching grooves 36 running through the strip-shaped portion 32 and the upper connecting portion 34. Each T-shaped latching groove 36 has a wide portion 361 on the strip-shaped portion 32, and a narrow portion 362 on the upper connecting portion 34. Each lower connecting portion 33 defines a number of latching holes 37 running through the lower connecting portion 33. In the present embodiment, the upper connecting portion 34 and lower connecting portion 33 are substantially perpendicular to the strip-shaped portion 32. The strip-shaped portion 32 includes a number of positioning protrusions 321 formed on the inner surface of the strip-shaped portion 32.

Figure 6:
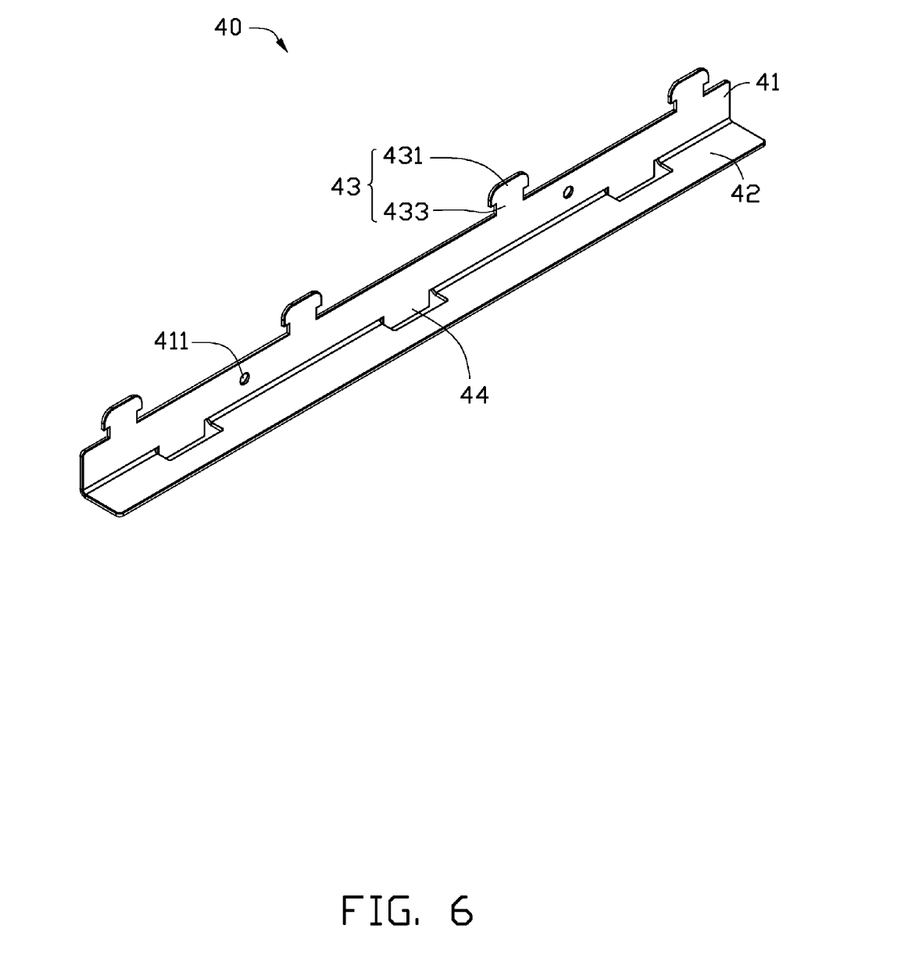
FIG. 6 is a schematic view of a supporting structure of the server holder of FIG. 1.
Figure 7:
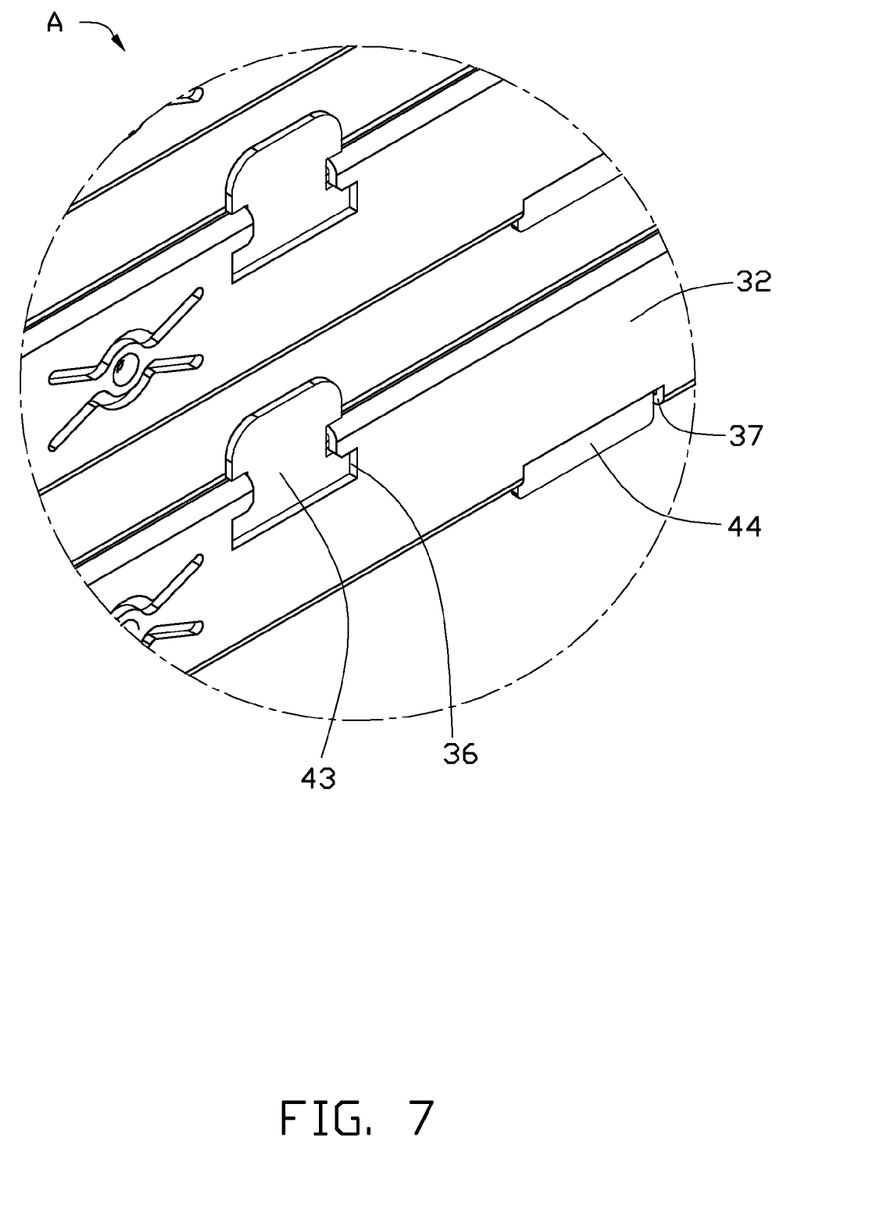
FIG. 7 is a magnified view of the circled portion A of FIG. 1.
Figure 8:
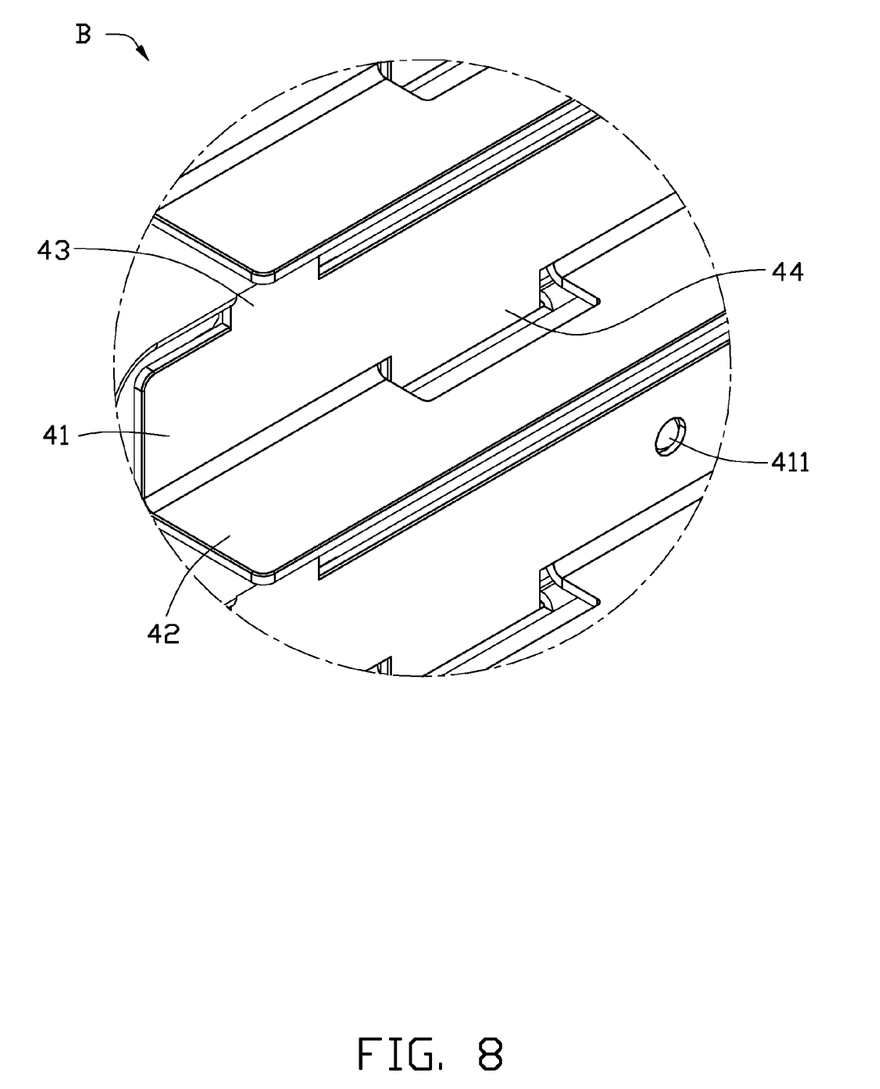
FIG. 8 is a magnified view of the circled portion B of FIG. 1.

Further referring to FIGS. 6 to 8, each supporting structure 40 includes a fixing strip 41, a supporting strip 42 connected to a side of the fixing strip 41, a number of T-shaped latching protrusions 43 extending upwards from a side of the fixing strip 41 away from the supporting strip 42. In addition, a number of latching blocks 44 extend downwards from another side of the fixing strip 41 connecting to the supporting strip 41. In this embodiment, the supporting structure 40 is an integrative configuration.

The fixing strip 41 is substantially perpendicular to the supporting strip 42, and is attached to the inner surface of the strip-shaped portion 32. The supporting strip 42 is configured for supporting the server 200. In this embodiment, the thickness of the fixing strip 41 is smaller than the depth of the receiving groove 35, thus, the bottom end of the fixing strip 41 can be completely supported by the inner surface of the lower connecting portion 33.

The T-shaped latching protrusion 43 includes a head portion 431 and a neck portion 433 connecting between the head portion 431 and the fixing strip 41. The width of the head portion 431 is larger than that of the neck portion 433, and is larger than the width of the narrow portion 362 of the T-shaped latching groove 36, thus, the head portion 431 of the T-shaped latching protrusion 43 can be latched in the narrow portion 362 of the T-shaped latching groove 36. The latching blocks 44 can be inserted into the latching holes 37. In the present embodiment, the fixing strip 41 defines a number of positioning holes 411 for engaging with the positioning protrusions 321 formed on the inner surface of the strip-shaped portion 32 to position the fixing strip 41.

Figure 9:
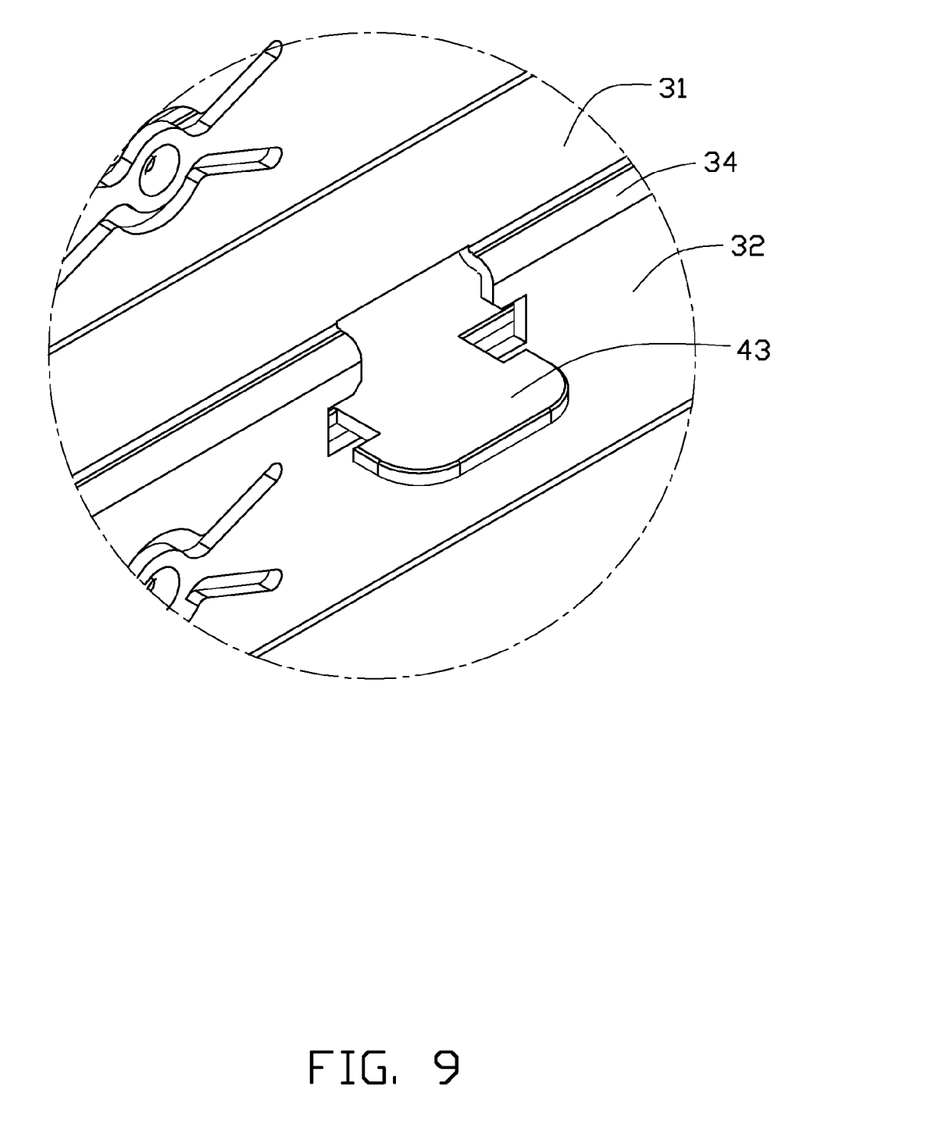
FIG. 9 is a schematic view showing the assembling of the supporting structure onto a lateral plate of the server holder.

Further referring to FIG. 9, during assembling of the supporting structure 40. The T-shaped latching protrusions 43 are inserted into the wide portion 361 of the T-shaped latching groove 36 first, then, the supporting structure 40 is rotated to attach the fixing strip 41 to the inner surface of the strip-shaped portion 32. After that, the supporting structure 40 is moved downwards for insertion of the latching blocks 44 into the latching holes 37. Thus, making the positioning holes 411 defined on the fixing strip 41 engage with the positioning protrusions 321 formed on the inner surface of the strip-shaped portion 32, therefore, the supporting structure 40 is be fixed on the lateral plate 30 of the server holder 100.

While certain embodiments have been described and exemplified above, various other embodiments will be apparent to those skilled in the art from the foregoing disclosure. The disclosure is not limited to the particular embodiments described and exemplified, and the embodiments are capable of considerable variation and modification without departure from the scope and spirit of the appended claims.

What is claimed is:

1. A server holder comprising:
   two opposite lateral plates, each lateral plate comprising:
   a main body;
   a plurality of strip-shaped portions protruding outwards from the main body, the strip-shaped portions extend transversely on the lateral plate; and
   a plurality of upper connecting portions, each upper connecting portion connecting a top end of a corresponding strip-shaped portion to the main body, each strip-shaped portion and the upper connecting portion connecting to the strip-shaped portion cooperatively defining a plurality of T-shaped latching grooves running through the strip-shaped portion and the upper connecting portion, each T-shaped latching groove having a wide portion on the strip-shaped portion, and a narrow portion on the upper connecting portion; and
   a plurality of supporting structures, each supporting structure comprising:
   a fixing strip attached to an inner surface of a corresponding strip-shaped portion;
   a supporting strip connecting to a side of the fixing strip for supporting a server; and
   a plurality of T-shaped latching protrusions extending upwards from a side of the fixing strip, each T-shaped latching protrusion inserting into the wide portion and latching in the narrow portion of a corresponding T-shaped latching groove.

2. The server holder as claimed in claim 1, wherein each upper connecting portion is substantially perpendicular to the corresponding strip-shaped portion.

3. The server holder as claimed in claim 1, wherein each lateral plate further comprises a plurality of lower connecting portions, each lower connecting portion connects a bottom end of a corresponding strip-shaped portion to the main body, each lower connecting portion defines a plurality of latching holes running through the lower connecting portion, each supporting structure further comprises a plurality of latching blocks extending downwards from another side of the fixing strip, each latching block inserts into a corresponding one of the latching holes.

4. The server holder as claimed in claim 3, wherein the strip-shaped portions are substantially parallel to the main body.

5. The server holder as claimed in claim 3, wherein the inner surface of each strip-shaped portion and the inner surfaces of the upper connecting portion and the lower connecting portion connecting to the strip-shaped portion cooperatively define a receiving groove, the thickness of each fixing strip is smaller than the depth of the receiving groove, the receiving groove receives a corresponding fixing strip.

6. The server holder as claimed in claim 3, wherein each lower connecting portion is substantially perpendicular to the corresponding strip-shaped portion.

7. The server holder as claimed in claim 1, wherein each strip-shaped portion further comprises a plurality of positioning protrusions positioned on the inner surface of the strip-shaped portion, each fixing strip defines a plurality of positioning holes, and each positioning hole engages with a corresponding one of the positioning protrusions.

8. The server holder as claimed in claim 1, wherein each T-shaped latching protrusion comprises a head portion and a neck portion connecting between the head portion and the fixing strip, the width of the head portion is larger than that of the neck portion, and is larger than the width of the narrow portion of the T-shaped latching groove, the neck portion is received in the narrow portion, the head portion is latched by the narrow portion.

9. The server holder as claimed in claim 1, wherein the fixing strip is substantially perpendicular to the supporting strip.

10. The server holder as claimed in claim 1, wherein each supporting structure is an integrative configuration.

11. A server system comprising:
    at least one server; and
    a server holder for receiving the at least one server, the server holder comprising:
    two opposite lateral plates, each lateral plate comprising:
    a main body;
    a plurality of strip-shaped portions protruding outwards from the main body, the strip-shaped portions extend transversely on the lateral plate; and
    a plurality of upper connecting portions, each upper connecting portion connecting a top end of a corresponding one of the strip-shaped portions to the main body, each strip-shaped portion and the upper connecting portion connecting to the strip-shaped portion cooperatively defining a plurality of T-shaped latching grooves running through the strip-shaped portion and the upper connecting portion, each T-shaped latching groove having a wide portion on the strip-shaped portion, and a narrow portion on the upper connecting portion;
    a plurality of supporting structures, each supporting structure comprising:
    a fixing strip attached to an inner surface of a corresponding strip-shaped portion;
    a supporting strip connecting to a side of the fixing strip for supporting one server; and
    a plurality of T-shaped latching protrusions extending upwards from a side of the fixing strip, each T-shaped latching protrusion inserting into the wide portion and latching in the narrow portion of the corresponding T-shaped latching groove;
    wherein each two supporting structures are opposite to and aligned with each other, and cooperatively hold one server.

12. The server system as claimed in claim 11, wherein each upper connecting portion is substantially perpendicular to the corresponding strip-shaped portion.

13. The server system as claimed in claim 11, wherein each lateral plate further comprises a plurality of lower connecting portions, each lower connecting portion connects a bottom end of a corresponding strip-shaped portion to the main body, each lower connecting portion defines a plurality of latching holes running through the lower connecting portion, each supporting structure further comprises a plurality of latching blocks extending downwards from another side of the fixing strip, each latching block inserts into a corresponding one of the latching holes.

14. The server system as claimed in claim 13, wherein the strip-shaped portions are substantially parallel to the main body.

15. The server system as claimed in claim 13, wherein the inner surface of each strip-shaped portion and the inner surfaces of the upper connecting portion and the lower connecting portion connecting to the strip-shaped portion cooperatively define a receiving groove, the thickness of each fixing strip is smaller than the depth of the receiving groove, the receiving groove receives a corresponding fixing strip.

16. The server system as claimed in claim 13, wherein each lower connecting portion is substantially perpendicular to the corresponding strip-shaped portion.

17. The server system as claimed in claim 11, wherein each strip-shaped portion further comprises a plurality of positioning protrusions positioned on the inner surface of the strip-shaped portion, and each fixing strip defines a plurality of positioning holes, and each positioning hole engages with a corresponding one of the positioning protrusions.

18. The server system as claimed in claim 11, wherein each T-shaped latching protrusion comprises a head portion and a neck portion connecting between the head portion and the fixing strip, the width of the head portion is larger than that of the neck portion, and is larger than the width of the narrow portion of the T-shaped latching groove, the neck portion is received in the narrow portion, the head portion is latched by the narrow portion.

19. The server system as claimed in claim 11, wherein the fixing strip is substantially perpendicular to the supporting strip.

20. The server system as claimed in claim 11, wherein each supporting structure is an integrative configuration.

* * * * *